United States Patent
Ono (10) Patent No.: US 12,438,013 B2
(45) Date of Patent: Oct. 7, 2025

(54) BATCH TYPE VERTICAL SUBSTRATE PROCESSING APPARATUS COMPRISING COOLING SYSTEM HAVING DISTRIBUTOR SUPPLYING COOLING FLUID TO PLURALITY OF FIRST COOLERS AND AUXILIARY SYSTEM, AND SUPPLYING MERGED COOLING FLUID TO SECOND COOLER

(71) Applicant: Kokusai Electric Corporation, Tokyo (JP)

(72) Inventor: Mikio Ono, Toyama (JP)

(73) Assignee: Kokusai Electric Corporation, Tokyo (JP)

(*) Notice: Subject to any disclaimer, the term of this patent is extended or adjusted under 35 U.S.C. 154(b) by 849 days.

(21) Appl. No.: 17/697,690

(22) Filed: Mar. 17, 2022

(65) Prior Publication Data
US 2022/0301899 A1    Sep. 22, 2022

(30) Foreign Application Priority Data
Mar. 18, 2021    (JP) .................................. 2021-044447

(51) Int. Cl.
| | | |
|---|---|---|
| H01L 21/67 | (2006.01) | |
| H01L 21/673 | (2006.01) | |
| H05B 1/02 | (2006.01) | |

(52) U.S. Cl.
CPC ...... *H01L 21/67109* (2013.01); *H01L 21/673* (2013.01); *H05B 1/0233* (2013.01)

(58) Field of Classification Search
CPC ............. H01L 21/67109; H01L 21/673; H01L 21/67757; H01L 21/67769; H01L 21/67098; H01L 21/67017; H05B 1/0233; F27D 9/00; F27D 2009/0005; F27D 2009/0013; C23C 16/463

See application file for complete search history.

(56) References Cited

U.S. PATENT DOCUMENTS

| | | | |
|---|---|---|---|
| 2010/0032425 A1* | 2/2010 | Shimada | ........... H01L 21/67109 |
| | | | 219/439 |
| 2015/0093909 A1* | 4/2015 | Murata | ............. C23C 16/45593 |
| | | | 438/758 |

FOREIGN PATENT DOCUMENTS

| | | |
|---|---|---|
| JP | 2000-249440 A | 9/2000 |
| JP | 2011-171657 A | 9/2011 |
| JP | 2015-001372 A | 1/2015 |

* cited by examiner

*Primary Examiner* — Ermias T Woldegeorgis
(74) *Attorney, Agent, or Firm* — Volpe Koenig (57) ABSTRACT

There is provided a technique that includes a plurality of first coolers installed in or around a process furnace configured to process a substrate, and configured to perform cooling by a cooling fluid; a second cooler installed in or around the process furnace and configured to perform cooling by the cooling fluid, the second cooler being not included in the plurality of first coolers; a distributor configured to distribute the cooling fluid supplied from a cooling fluid supply port to the plurality of first coolers and an auxiliary system bypassing the plurality of first coolers; and a merging part configured to merge the cooling fluid passed through the plurality of first coolers and the cooling fluid passed through the auxiliary system, respectively, and supply the merged cooling fluid to the second cooler.

15 Claims, 7 Drawing Sheets

BATCH TYPE VERTICAL SUBSTRATE PROCESSING APPARATUS COMPRISING COOLING SYSTEM HAVING DISTRIBUTOR SUPPLYING COOLING FLUID TO PLURALITY OF FIRST COOLERS AND AUXILIARY SYSTEM, AND SUPPLYING MERGED COOLING FLUID TO SECOND COOLER

CROSS-REFERENCE TO RELATED APPLICATION

This application is based upon and claims the benefit of priority from Japanese Patent Application No. 2021-044447, filed on Mar. 18, 2021, the entire contents of which are incorporated herein by reference.

TECHNICAL FIELD

The present disclosure relates to a substrate processing apparatus and a method of manufacturing a semiconductor device.

BACKGROUND

According to a related art, in a method of manufacturing a semiconductor device, a substrate processing apparatus for performing a predetermined process by heating the inside of a process furnace may be used, and cooling water may be allowed to flow to cooling-required points of the heated process furnace to perform cooling.

The required flow rate of cooling water differs depending on the cooling units arranged at the cooling-required points. When there are multiple cooling units, if the flow rate of the cooling water supplied to one of the cooling units is increased, due to the opening and closing of a valve for the cooling water supplied to the cooling unit having a large flow rate of cooling water, the flow rate of the cooling water supplied to other cooling units adjusted to a constant flow rate may fluctuate in some cases. In addition, there is a demand to reduce the total consumption of cooling water.

SUMMARY

Some embodiments of the present disclosure provide a technique capable of stably supplying cooling fluid to multiple cooling units while reducing the total consumption of the cooling fluid.

According to one embodiment of the present disclosure, there is provided a technique that includes a plurality of first coolers installed in or around a process furnace configured to process a substrate, and configured to perform cooling by a cooling fluid; a second cooler installed in or around the process furnace and configured to perform cooling by the cooling fluid, the second cooler being not included in the plurality of first coolers; a distributor configured to distribute the cooling fluid supplied from a cooling fluid supply port to the plurality of first coolers and an auxiliary system bypassing the plurality of first coolers; and a merging part configured to merge the cooling fluid passed through the plurality of first coolers and the cooling fluid passed through the auxiliary system, respectively, and supply the merged cooling fluid to the second cooler.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments will be described with reference to the drawings. It should be noted that the drawings used in the following description are schematic and the relationship between the dimensions of respective elements, the ratio of respective elements, and the like shown in the drawings do not always match the actual ones. In addition, even among the plurality of drawings, the relationship between the dimensions of respective elements, the ratio of respective elements, and the like do not always match.

(1) CONFIGURATION OF SUBSTRATE PROCESSING APPARATUS

Figure 1:
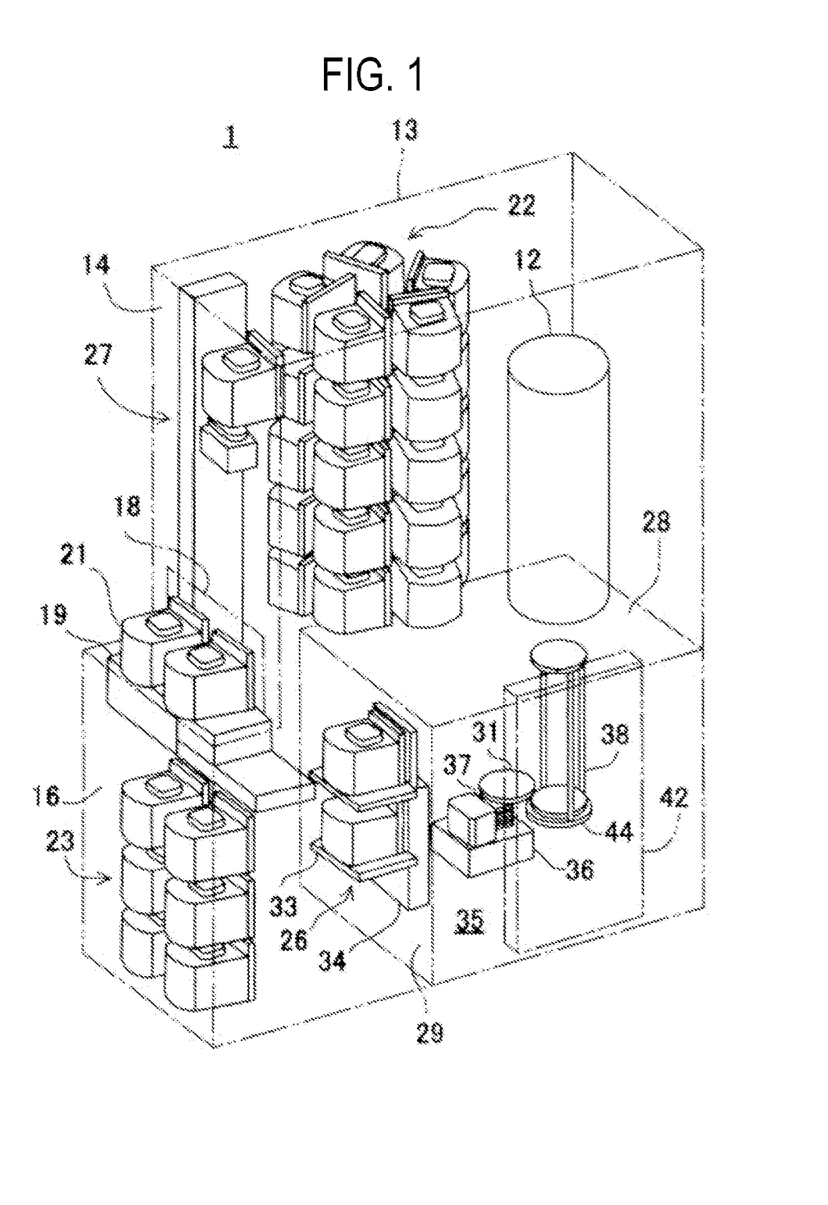
FIG. 1 is a perspective view showing a substrate processing apparatus preferably used in one embodiment of the present disclosure.
Figure 2:
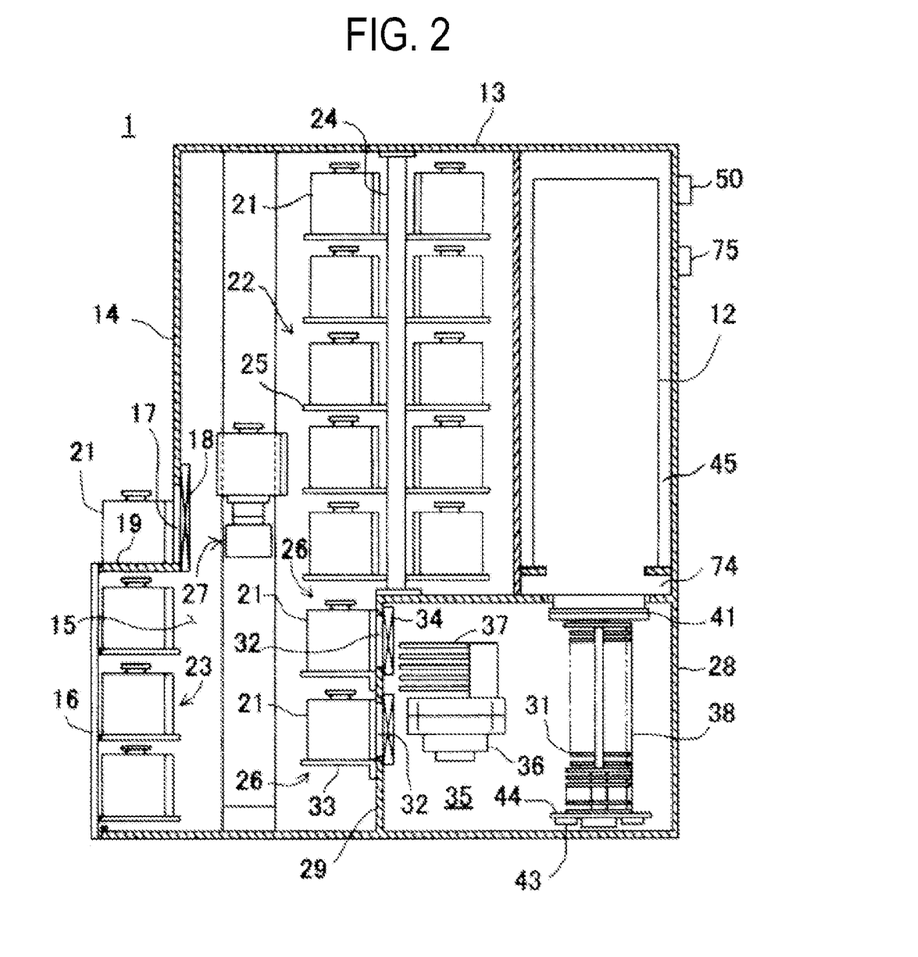
FIG. 2 is a side view showing the substrate processing apparatus preferably used in one embodiment of the present disclosure.

As shown in FIGS. 1 and 2, the substrate processing apparatus 1 includes a housing 13. A front maintenance port 15 as an opening for maintenance is provided at a lower portion of a front wall 14 of the housing 13. The front maintenance port 15 is opened and closed by a front maintenance door 16.

A pod loading/unloading port 17 is provided on the front wall 14 of the housing 13 to bring the inside and outside of the housing 13 in fluid communication with each other. The pod loading/unloading port 17 is opened and closed by a front shutter 18. A load port 19 is installed in front of the pod loading/unloading port 17. The load port 19 is configured to align a pod 21 mounted thereon.

The pod 21 is a closed-type substrate container. The pod 21 is carried on the load port 19 by an in-process transfer device (not shown) and is also carried out from the load port 19.

A rotary pod shelf 22 is installed at an upper portion in a substantially central portion in a front-rear direction in the housing 13. The rotary pod shelf 22 is configured to store a plurality of pods 21. Further, a spare pod shelf 23 is installed in the front maintenance port 15 below the load port 19. The spare pod shelf 23 is configured to store a plurality of pods 21.

The rotary pod shelf 22 includes a support column 24 that is vertically erected and intermittently rotated, and a plurality of shelf boards 25 that are radially supported on the support column 24 at the respective positions of the upper, middle and lower stages. Each of the shelf boards 25 is configured to store a plurality of pods 21 in a mounted state.

A pod opener 26 is installed below the rotary pod shelf 22. The pod opener 26 is configured to mount the pod 21 thereon and open and close a lid of the pod 21.

A pod transfer device 27 is installed between the load port 19, the rotary pod shelf 22, and the pod opener 26. Further, the pod transfer device 27 can hold the pod 21 and can move up and down, move forward and backward, and move laterally. The pod transfer device 27 is configured to transfer the pod 21 between the load port 19, the rotary pod shelf 22, and the pod opener 26.

A sub-housing 28 is installed over a rear end in a lower portion of the housing 13 on a rear side in the front-rear direction. On the front wall 29 of the sub-housing 28, a pair of wafer loading/unloading ports 32 for loading and unloading the wafer (substrate) 31 with respective to the sub-housing 28 are arranged vertically in two upper and lower stages. A pod opener 26 is installed for each of the upper and lower wafer loading/unloading ports 32.

The pod opener 26 includes a mounting table 33 on which the pod 21 is mounted, and an opening/closing mechanism 34 for opening and closing the lid of the pod 21. The pod opener 26 is configured to open and close the wafer inlet/outlet of the pod 21 by opening and closing the lid of the pod 21 mounted on the mounting table 33 by the opening/closing mechanism 34.

The sub-housing 28 constitutes a delivery chamber (loading area) 35 kept airtight from the space (pod transfer space) in which the pod transfer device 27 and the rotary pod shelf 22 are arranged. A delivery machine (wafer transfer mechanism) 36 is installed in a front region of the delivery chamber 35. The delivery machine 36 has a required number of (five, in the figure) wafer mounting plates (substrate support) 37 for holding wafers 31. The wafer mounting plates 37 can move linearly in a horizontal direction, can rotate in the horizontal direction, and can move up and down in the vertical direction. The delivery machine 36 is configured to charge and discharge the wafers 31 into and out of a boat (substrate holder) 38.

A heater chamber 45 is installed above the delivery chamber 35 with a scavenger 74 interposed therebetween. A vertical process furnace 12 is installed in the heater chamber 45. The process furnace 12 forms a process chamber therein. The lower furnace opening of the process chamber is located in the scavenger 74. The lower end of the furnace opening is opened and closed by a furnace opening shutter 41.

A boat elevator 42 for raising and lowering the boat 38 is installed on a side surface of the sub-housing 28. A seal cap 44 as a lid is horizontally attached to an arm 43 connected to the lift of the boat elevator 42. The seal cap 44 vertically supports the boat 38 and airtightly closes the furnace operation portion in a state in which the boat 38 is loaded into the process furnace 12. The boat 38 is configured to hold a plurality of (e.g., about 50 to 175) wafers 31 at in multiple stages in a horizontal posture in a state in which the wafers 31 are aligned with the center of the boat 38.

A cleaner (not shown) is arranged at a position facing the boat elevator 42 side. The cleaner is composed of a supply fan and a dustproof filter so as to supply a clean atmosphere or a clean air which is an inert gas. A notch alignment device (not shown) as a substrate matching device for aligning circumferential positions of the wafers 31 is installed between the delivery machine 36 and the cleaner.

Next, the operation of the substrate processing apparatus 1 will be described.

When the pod 21 is supplied to the load port 19, the pod loading/unloading port 17 is opened by the front shutter 18. The pod 21 on the load port 19 is loaded into the housing 13 by the pod transfer device 27 through the pod loading/unloading port 17 and is placed on the designated shelf board 25 of the rotary pod shelf 22. The pod 21 is temporarily stored in the rotary pod shelf 22. Then, the pod 21 is transferred from the shelf board 25 to one of the pod openers 26 by the pod transfer device 27 and mounted on the mounting table 33 or is directly transferred from the load port 19 to the mounting table 33.

An opening side end surface of the pod 21 mounted on the mounting table 33 is pressed against the opening edge of the wafer loading/unloading port 32 on the front wall 29 of the sub-housing 28. The lid of the pod 21 is removed by the opening/closing mechanism 34 to open the wafer inlet/outlet port.

When the pod 21 is opened by the pod opener 26, the delivery machine 36 takes out the wafer 31 from the pod 21 and charges the wafer 31 into the boat 38. The delivery machine 36 that has delivered the wafer 31 to the boat 38 returns to the pod 21 and charges the next wafer 31 into the boat 38.

When a predetermined number of wafers 31 are charged to the boat 38, the furnace opening of the process furnace 12 closed by the furnace opening shutter 41 is opened by the furnace opening shutter 41. Subsequently, the boat 38 is lifted by the boat elevator 42 and loaded into the process furnace 12.

After loading the boat 38, an arbitrary process is performed on the wafer 31 in the process furnace 12. After performing the process, the wafer 31 and the pod 21 are carried out of the housing 13 by the reverse procedure of the above procedure.

(2) CONFIGURATION OF PROCESS FURNACE (AIR COOLING SYSTEM)

Figure 3:
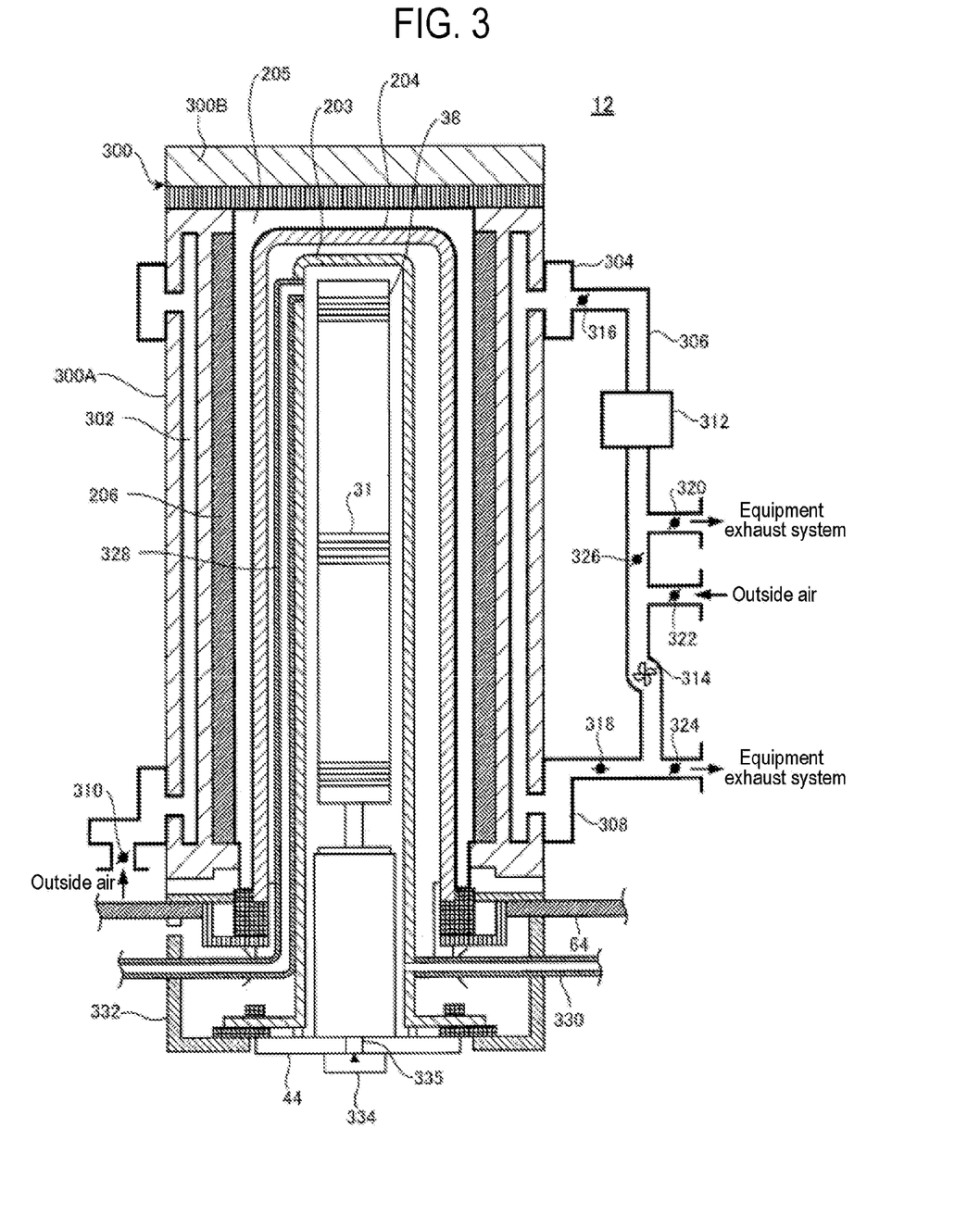
FIG. 3 is a vertical sectional view of a process furnace preferably used in one embodiment of the present disclosure.

FIG. 3 is a vertical sectional view showing the process furnace 12 and the surroundings thereof. The process furnace 12 includes a reaction tube 203 having a cylindrical shape and configured to be loaded with the boat 38, a liner tube 204 configured to accommodate the reaction tube 203 therein, a heat insulating wall 300 configured to internally form a cylindrical reaction tube accommodation chamber 205 as an example of a reactor accommodation chamber for accommodating the liner tube 204 and composed of a side surface heat insulating material 300A for forming the side wall surface of the reaction tube accommodation chamber 205 and a ceiling surface insulating material 300B for forming a ceiling surface of the reaction tube accommodation chamber 205, a heater 206 installed on the inner wall of the reaction tube accommodation chamber 205 in the heat insulating wall 300, an air flow path 302 formed concentrically with the inner wall surface of the reaction tube accommodation chamber 205 inside the side surface heat insulating material 300A and the heater 206 installed on the inner wall of the reaction tube accommodating chamber 205 in the heat insulating wall 300 to extend in the vertical direction, an upper chamber 304 configured to fluid communicate with the air flow path 302 at the upper end of the air flow path 302 and form a part of an air circulation path 306 described later, a lower chamber 308 configured to fluid communicate with the air flow path 302 at the lower end of the air flow path 302 and form a part of the air circulation path 306 described later, and an air circulation path 306 configured to bring the upper chamber 304 and the lower chamber 308 into communication with each other.

The lower chamber 308 is installed with an intake valve 310, which is an on-off valve in fluid communicate with the outside air.

On the other hand, a radiator 312 as an example of an air cooling means is installed near the upper chamber 304 on the air circulation path 306, and a fan 314 as an example of an air flow means is installed near the lower chamber 308.

An on-off valve 316 is installed between the upper chamber 304 and the radiator 312 in the air circulation path 306, and an on-off valve 318 is installed between the fan 314 and the lower chamber 308. An exhaust valve 320, which is an on-off valve in fluid communicate with the equipment exhaust system, and an intake valve 322, which is an on-off valve in fluid communicate with the outside air, are installed between the radiator 312 and the fan 314. Further, an exhaust valve 324, which is an on-off valve in fluid communicate with the equipment exhaust system, is installed between the fan 314 and the on-off valve 318, and an on-off valve 326 is installed between the exhaust valve 320 and the intake valve 322.

In the process furnace 12, the intake valves 310 and 322 and the on-off valve 318 correspond to first valves of the present disclosure, and the exhaust valve 320 and 324 and the on-off valve 316 correspond to second valves of the present disclosure.

That is, the process furnace 12 includes an air cooling system that circulates an air, which is a heat medium for cooling the furnace body.

Further, in the process furnace 12, there are installed a gas introduction pipe line 328 for introducing a precursor gas or/and an inert gas into the reaction tube 203 and a gas discharge pipe line 330 for discharging the precursor gas or/and the inert gas introduced into the reaction tube 203 to the outside of the reaction tube 203. Below the process furnace 12, an inlet flange 332 is arranged concentrically with the reaction tube 203. An O-ring as a seal is installed between the inlet flange 332 and the reaction tube 203. The gas introduction pipe line 328 and the gas discharge pipe line 330 are installed so as to penetrate the side wall of the inlet flange 332.

On the opposite side of the seal cap 44 from the inside of the reaction tube 203, a boat rotator 334 for rotating the boat 38 accommodating the wafers 31 is installed. A rotation shaft 335 of the boat rotator 334 is formed to penetrate the seal cap 44 and is connected to the boat 38. The boat rotator 334 is configured to rotate the wafers 31 by rotating the boat 38.

(3) CONFIGURATION OF WATER COOLING SYSTEM

Figure 4:
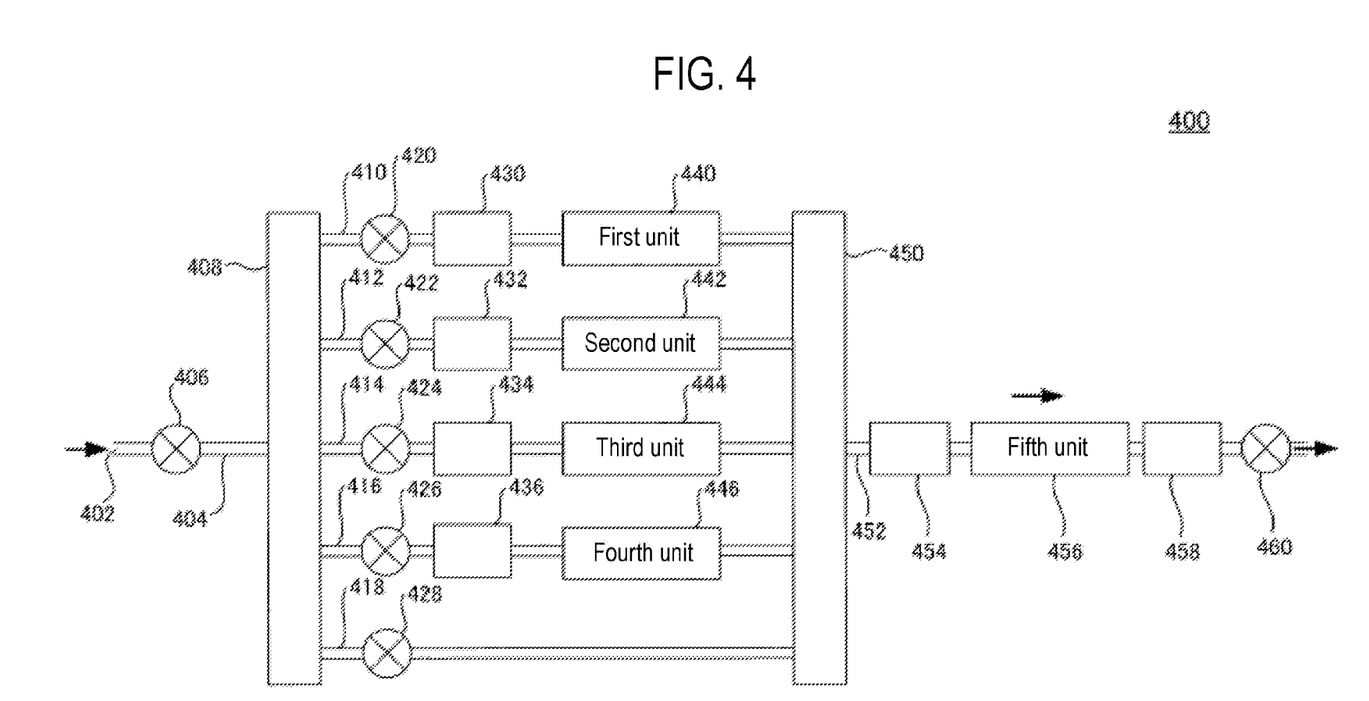
FIG. 4 is a configuration diagram showing a water cooling system preferably used in one embodiment of the present disclosure.

Next, the water cooling system preferably used in one embodiment of the present disclosure will be described with reference to FIG. 4.

The water cooling system 400 supplies a cooling fluid (brine) such as cooling water or the like to a plurality of units as cooling-required points of the substrate processing apparatus 1 to thereby cool the respective units.

The water cooling system 400 mainly includes a supply pipe 404, a water supply side manifold 408 as a distributor, a plurality of first coolers including a first unit 440, a second unit 442, a third unit 444 and a fourth unit 446, an auxiliary system described later, a water drainage side manifold 450 as a merging part, a water drainage pipe 452, and a second cooler including a fifth unit 456.

In the supply pipe 404, a valve 406, which is an on-off valve or a control valve, is installed at a connection portion connected to factory equipment that provides a cooling fluid. The valve 406 is, for example, a globe valve or a ball valve, and can be used for finely adjusting the total amount of the cooling fluid among a plurality of substrate processing apparatuses 1 or for shutting off the cooling fluid during maintenance.

The water supply side manifold 408 distributes the cooling fluid supplied from the cooling fluid supply port 402 to the first unit 440, the second unit 442, the third unit 444, the fourth unit 446, and the pipe 418 which is an auxiliary system.

The water drainage side manifold 450 merges the cooling fluid that have passed through the first unit 440, the second unit 442, the third unit 444, the fourth unit 446, and the pipe 418, and supplies the merged cooling fluid to the fifth unit 456 through the water drainage pipe 452.

Pipes 410, 412, 414, 416, and 418 are connected in parallel between the water supply side manifold 408 and the water drainage side manifold 450.

In the pipes 410, 412, 414, and 416, needle valves 420, 422, 424, and 426, flow meters 430, 432, 434, and 436, a first unit 440, a second unit 442, a third unit 444, and a fourth unit 446 are installed sequentially from the upstream side. The first unit 440, the second unit 442, the third unit 444, and the fourth unit 446 supply the cooling fluid in parallel. In this regard, the needle valves 420, 422, 424, and 426 are control valves that are automatically opened and closed by a controller 600 and are configured so that the opening degree described later can be continuously changed by electric control. After adjusting the flow rate so as to secure the required flow rate for each unit, the needle valves are operated in a fixed state, and the controller 600 monitors the flow rate of the flow meter. The controller 600 is configured to generate an alarm or automatically readjust the flow rate when the monitored flow rate deviates from a predetermined range. As used herein, the term "required flow rate" refers to a flow rate required to maintain each unit or its cooling target at a desired temperature or lower.

Further, a needle valve 428 is installed in the pipe 418. That is, the pipe 418 is configured to directly connect the water supply side manifold 408 and the water drainage side manifold 450 via the needle valve 428. The pipe 418 may be used as an auxiliary system in which the needle valve 428 is opened and closed to bypass the first to fourth units through which the cooling fluid flows from the water supply side manifold 408 to the water drainage side manifold 450. As described below, the flow rate in the pipe 418 can be set to minimize the energy consumed for air cooling and water cooling.

A heat exchanger 454, a fifth unit 456, a flow meter 458 and a valve 460 are installed in the water drainage pipe 452 sequentially from the upstream side. The heat exchanger 454 is installed between the water drainage side manifold 450 and the fifth unit 456 to cool the cooling fluid. The heat exchanger 454 is configured to cool the cooling fluid merged in the water drainage side manifold 450 by the heat exchange with an ambient air or a gas (high concentration inert gas) discharged from the delivery chamber 35 to the equipment exhaust system. The valve 460 can be used similarly to the valve 406. The heat exchanger 454 does not have to be installed. For example, if the pipe between the water drainage side manifold 450 and the first to fourth units and the fifth unit 456 is long enough to obtain the low water temperature required for cooling the fifth unit 456, the heat exchanger 454 may be omitted. In this case, the flow rate of the cooling fluid may be increased by controlling the needle valve 428 of the pipe 418 which is an auxiliary system.

The first unit 440, the second unit 442, the third unit 444, and the fourth unit 446 cool different objects, and at least one of them cools the furnace opening of the process furnace 12. The first unit 440, the second unit 442, the third unit 444, and the fourth unit 446 are units provided in or around the process furnace 12 for processing the wafers 31 and configured to perform cooling by a cooling fluid having a small flow rate.

The fifth unit 456 is a cooler provided in or around the process furnace 12 for processing the wafer 31 and configured to cool, by using a cooling fluid having a large flow rate, the furnace body of the process furnace 12 or the air or the like as a heat medium which has been used for cooling the furnace body. In other words, the fifth unit 456 has the largest required flow rate of the cooling fluid or the largest amount of heat discharged to the cooling fluid among the first unit 440, the second unit 442, the third unit 444, the fourth unit 446, and the fifth unit 456.

The amount of heat received by the cooling fluid in the fifth unit 456 per unit time varies depending on the temperature of the process furnace 12 and the temperature lowering rate. That is, the fifth unit 456 cools an object having a fluctuating heat reception amount and performs heat exchange between the furnace body or the air and the cooling fluid. The air or the like heated by the furnace body heats the surroundings while being discharged to the equipment exhaust system and accelerates the failure of electronic devices and the outgassing of impurities such as phosphorus and the like. Therefore, the air or the like heated by the furnace body is preferably cooled by the fifth unit 456 immediately after flowing out from the process furnace 12. Further, the sufficiently cooled air can be used for cooling again, the air discharged by air cooling can be reduced, and the energy consumed for the air can be reduced.

The first unit 440, the second unit 442, the third unit 444, and the fourth unit 446 are used to cool, for example, the furnace opening of the process furnace 12, the inlet flange 332, the seal cap 44, the boat rotator 334, the casing of the process furnace 12, the atmosphere in the delivery chamber 35, and the like.

For example, an embedded flow path for a cooling fluid is formed in the inlet flange 332 and is configured to cool the O-ring or the like that seals the furnace opening of the process furnace 12. Further, the seal cap 44, the boat rotator 334, the casing of the process furnace 12, the delivery chamber, and the like are configured to be cooled by the cooling fluid flowing around them. Moreover, the radiator that cools the atmosphere in the transfer chamber 35 may be cooled by the cooling fluid. In addition, it may be possible to use a cooling jacket capable of being attached to a portion that requires cooling.

The fifth unit 456 is, for example, a radiator 312, and is configured to cool the air flowing in the process furnace 12 when the process furnace 12 is rapidly cooled. In the auxiliary system, the opening degree of the needle valve 428 is set semi-fixedly according to the maximum amount of heat received by the radiator 312, and the air after passing through the radiator 312 is kept at a predetermined temperature or lower. Alternatively, the opening degree of the needle valve 428 can be changed according to a change in the amount of heat received by the radiator 312, and the opening degree of the needle valve 428 can be set to zero except during rapid cooling. This makes it possible to save the use amount of the cooling fluid while substantially maintaining the cooling capacity when rapidly cooling the process furnace 12. An on-off valve may be installed in series with the needle valve 428 in order to switch the amount of water in the auxiliary system according to the operating status of the fifth unit 456. In that case, the auxiliary system has a pipe 418, a needle valve 428 and an on-off valve.

That is, the water cooling system 400 distributes the cooling fluid introduced from the cooling fluid supply port 402 to the five pipes 410, 412, 414, 416, and 418 via the needle valve 406 and the water supply side manifold 408.

Then, the cooling fluid distributed to the pipes 410, 412, 414, and 416 flow through the first unit 440, the second unit 442, the third unit 444, and the fourth unit 446 via the needle valves 420, 422, 424, and 426 and the flow meters 430, 432, 434, and 436, respectively, and merge at the water drainage side manifold 450. In addition, the cooling fluid distributed to the pipe 418 flows through the needle valve 428 and merges at the water drainage side manifold 450.

Then, the cooling fluid merged in the water drainage side manifold 450 passes through the fifth unit 456 and returns to the factory equipment via the flow meter 458 and the valve 460.

That is, the cooling fluid supplied to the first unit 440, the second unit 442, the third unit 444, and the fourth unit 446 having a small flow rate are merged and supplied to the fifth unit 456 having a maximum flow rate. As a result, the use amount of the cooling fluid can be reduced as compared with the case where the cooling fluid are supplied in parallel to all the units. Further, the fluctuation of the flow rate of the cooling fluid of the entire substrate processing apparatus 1 can be reduced as compared with the case where the supply of the cooling fluid of the fifth unit 456 is turned on and off in order to save the cooling fluid. Thus, the cooling fluid can be stably supplied to each unit, and the water hammer phenomenon and the pipe damage and water leakage caused by the water hammer phenomenon can be suppressed.

In this regard, the minimum required flow rate of the cooling fluid of the fifth unit 456 is preferably not more than the total value of the minimum required flow rates of the first unit 440, the second unit 442, the third unit 444, and the fourth unit 446. As a result, the use amount of cooling fluid can be minimized usually without having to use the auxiliary system.

If the total value of the required flow rates of the cooling fluid in the first unit 440, the second unit 442, the third unit 444, and the fourth unit 446 is less than the required flow rate of the cooling fluid in the fifth unit 456, the cooling fluid can be replenished by adjusting the opening degree of the needle valve 428 of the pipe 418 in the auxiliary system. The cold cooling fluid from the pipe 418 of the auxiliary system that bypasses the cooling unit can lower the temperature of the cooling fluid in the fifth unit 456.

As described above, by adopting the cascade structure for supplying water to the respective units, it is possible to reduce the total consumption of the cooling fluid used in the water cooling system 400.

Further, even when the water is saved in the water cooling system 400, it is possible to maintain a minute flow rate without setting the flow rate of the cooling fluid to 0 in all the pipes. This makes it possible to prevent the cooling fluid from decaying, algae from breeding, and rust from accumulating. Further, it is indicated in the SEMI/ISMI standard S23 as an energy conversion factor (ECF) that energy saving is achieved when the flow rate of the cooling fluid is reduced even if the total amount of heat discharged to the cooling fluid does not change. That is, in the case of cooling water (25 degrees C. or higher) supplied from a cooling tower, energy consumption is determined by the used flow rate, regardless of the rise in water drainage temperature. Even in the case of cooling water (less than 25 degrees C.) supplied from a chiller, energy consumption depends on the used flow rate. In the process furnace 12 according to the present disclosure, the air from the process furnace 12 is cooled by the cooling fluid. Therefore, as the flow rate of the cooling fluid is increased, the circulating air is cooled and the amount of air introduced from the outside and the amount of exhaust are reduced.

(4) CONFIGURATION OF CONTROLLER

The substrate processing apparatus 1 includes a controller 600 that controls the operation of each part of the substrate processing apparatus 1.

Figure 5:
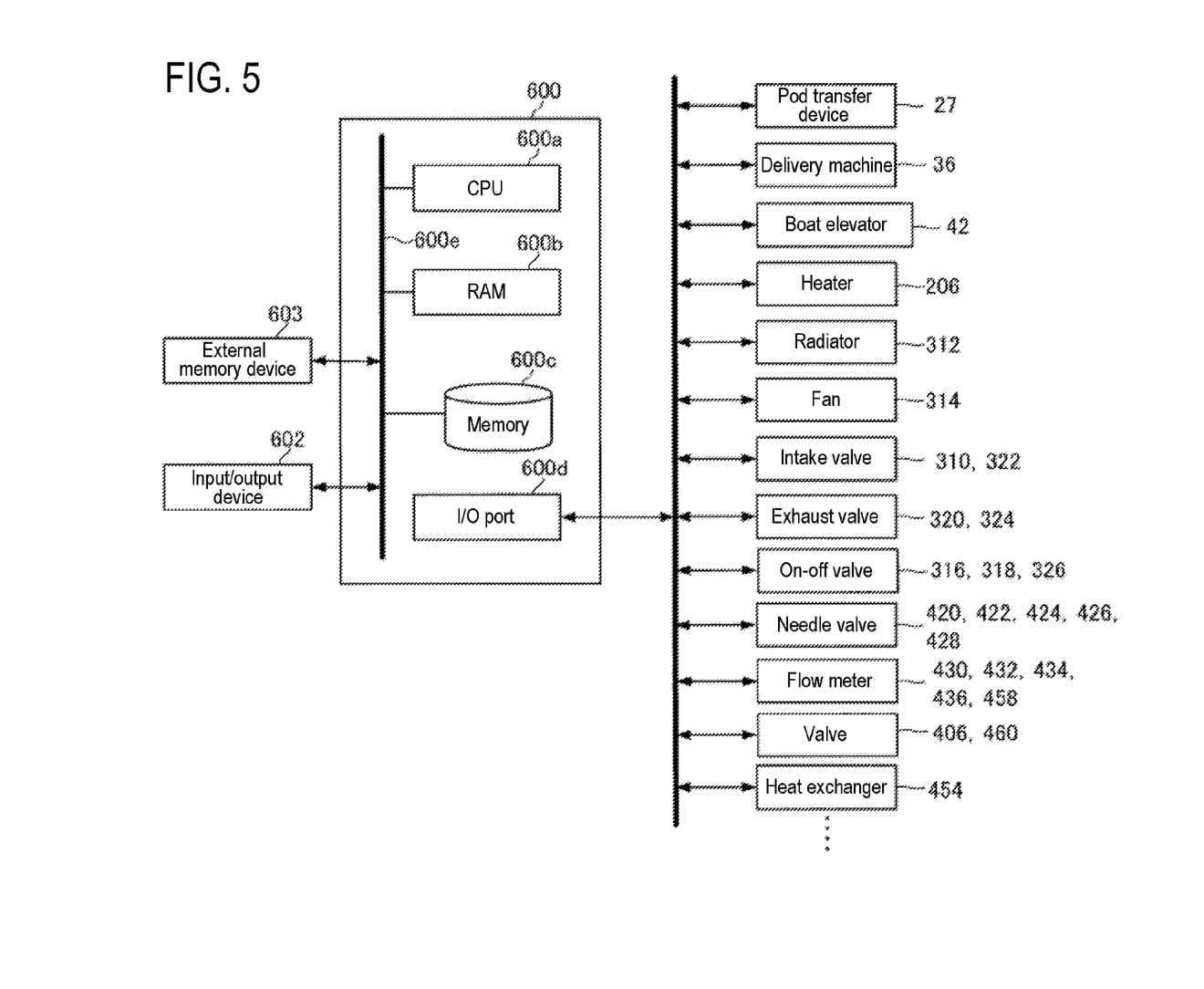
FIG. 5 is a schematic configuration diagram of a controller of the substrate processing apparatus preferably used in one embodiment of the present disclosure, in which the control system of the controller is shown in a block diagram.

The outline of the controller 600 is shown in FIG. 5. The controller 600, which is a control part (control means), is configured as a computer including a CPU (Central Processing Unit) 600a, a RAM (Random Access Memory) 600b, a memory 600c and an I/O port 600d. The RAM 600b, the memory 600c and the I/O port 600d are configured to exchange data with the CPU 600a via an internal bus 600e. An input/output device 602 configured as, for example, a touch panel or the like, and an external memory device 603 such as a thumb memory or the like may be connected to the controller 600.

The memory 600c is composed of, for example, a flash memory, an HDD (Hard Disk Drive), or the like. The memory 600c readably stores a control program for controlling the operation of the substrate processing apparatus 1, a process recipe in which a procedure and conditions for a substrate processing process described later, and the like. The process recipe is configured to cause the controller 600 to execute each procedure in the substrate processing process described later and obtain a predetermined result. The process recipe functions as a program. Hereinafter, the process recipe, the control program, and the like are collectively and simply referred to as a program. When the term program is used in the subject specification, it may include a process recipe, a control program alone, or both. The RAM 600b is configured as a memory area (work area) in which programs, data, and the like read by the CPU 600a are temporarily held.

The I/O port 600d is connected to the pod transfer device 27, the delivery machine 36, the boat elevator 42, the heater 206, the radiator 312, the fan 314, the intake valves 310 and 322, the exhaust valves 320 and 324, the on-off valves 316, 318 and 326, the needle valves 420, 422, 424, 426 and 428, the flow meters 430, 432, 434, 436 and 458, the valves 406 and 460, the heat exchanger 454, and the like.

The CPU 600a is configured to read the control program from the memory 600c and execute the same and is configured to read the process recipe from the memory 600c in response to the input of an operation command from the input/output device 602 or the like. The CPU 600a is configured to control, according to the content of the process recipe thus read, the pod transfer operation performed by the pod transfer device 27, the delivery operation of the wafer 31 performed by the delivery machine 36, the raising and lowering operation of the boat 38 performed by the boat elevator 42, the rotating operation of the boat 38 performed by the boat rotator 334, the temperature adjustment operation of the heater 206, the opening/closing operations of the intake valves 310 and 322, the on-off valves 316, 318, and 326 and the exhaust valves 320 and 324, the start and stop of the radiator 312 and the fan 314, the opening/closing operations of the needle valves 420, 422, 424, 426, and 428 and the valves 406 and 460, the flow rate adjustment operation for the cooling fluid performed by the flow meters 430, 432, 434, 436, and 458, the start and stop of the heat exchanger 454, and the like.

(5) SUBSTRATE PROCESSING PROCESS USING SUBSTRATE PROCESSING APPARATUS

Figure 6:
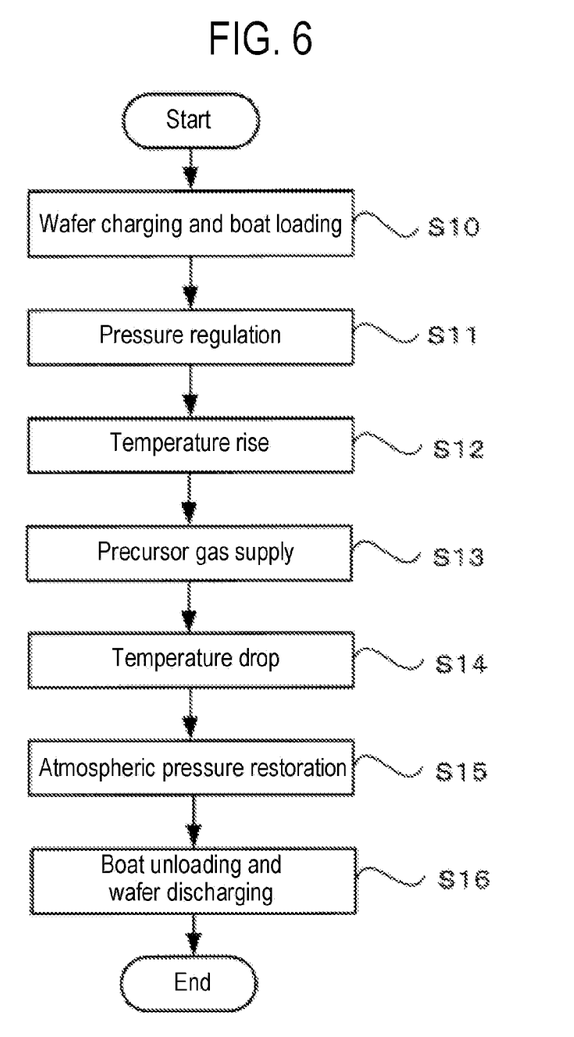
FIG. 6 is a diagram showing a flow of a substrate processing process preferably used in one embodiment of the present disclosure.

Next, a sequence example of a process of forming a film on the wafer 31 (hereinafter also referred to as a film-forming process) using the above-mentioned substrate processing apparatus 1 will be described as a semiconductor device manufacturing process. Here, an example of forming a film on the wafer 31 by supplying a precursor gas to the wafer 31 will be described. In the following description, the operation of each part constituting the substrate processing apparatus 1 is controlled by the controller 600.
(S10: Wafer Charging and Boat Loading)

First, the standby state of the apparatus is released, a plurality of wafers 31 is charged to the boat 38 (wafer charging), and the boat 38 is loaded into the process furnace 12 by the boat elevator 42 (boat loading).
(S11: Pressure Regulation)

Vacuum exhaust (Depressurization exhaust) is performed by the vacuum pump provided in the gas discharge pipe line 330 so that the inside of the reaction tube 203, i.e., the space where the wafers 31 exists, has a predetermined pressure (vacuum degree). At this time, the pressure in the reaction tube 203 is measured by the pressure sensor, and the APC valve is feedback-controlled based on the measured pressure information. The vacuum pump is always kept in operation until at least the processing of the wafers 31 is completed.
(S12: Temperature Rise)

Further, the inside of the reaction tube 203 is heated by the heater 206 so that the wafers 31 in the reaction tube 203 have a predetermined temperature. At this time, the supply of electric power to the heater 206 is feedback-controlled based on the temperature information detected by a temperature detector so that an inside of the reaction tube 203 has a predetermined temperature distribution. The heating in the reaction tube 203 by the heater 206 is continuously performed at least until the processing of the wafers 31 is completed.

The controller 600 closes the intake valve 310, the on-off valve 316 and the on-off valve 318 until the temperature inside the reaction tube 203, i.e., the temperature of the wafers 31, reaches a target temperature after the temperature rise of the wafers 31 is started. At this time, a predetermined amount of cooling fluid is circulated in the radiator 312. On the other hand, from the viewpoint of reducing power consumption, it is preferable that the on-off valve 320 and the exhaust valves 320 and 324 are also closed and the fan 314 is stopped.

As a result, the air flow path 302 is out of communication with the outside air and the equipment exhaust system, so that the air flow in the air flow path 302 is also stopped. Not only the heat insulating material forming the heat insulating wall 300, but also the air in the air flow path 302 functions as a heat insulating material, whereby the temperature inside the reaction tube 203 rises rapidly.

(S13: Precursor Gas Supply)

When the temperature in the reaction tube 203 is maintained at the preset processing temperature, a precursor gas is supplied to the wafers 31 in the reaction tube 203. The precursor gas introduced into the reaction tube 203 through the gas introduction pipe line 328 flows down in the reaction tube 203 and flows out to the outside of the reaction tube 203 via the gas discharge pipe line 330. When passing through the reaction tube 203, the precursor gas comes into contact with the surfaces of the wafers 31, so that the wafers 31 are subjected to, for example, oxidation, diffusion, or the like.

(S14: Temperature Drop)

In this step, the temperature rise in step S12, which has been continued during the film-forming process, is stopped, and the temperature inside the reaction tube 203 is rapidly dropped.

The controller 600 opens the on-off valve 316 to start the operation of the fan 314 and opens the intake valve 310, the on-off valve 326, and the exhaust valve 324. As a result, the air as a heat medium flowing out of the air flow path 302 and cooled by the radiator 312 is sucked and discharged from the exhaust valve 324 to the equipment exhaust system (equipment exhaust duct). Alternatively, the intake valve 322 and the exhaust valve 320 installed between the radiator 312 and the fan 314 are opened, the air introduced from the intake valve 322 is pumped into the air flow path 302, and the air flowing out of the air flow path 302 and cooled by the radiator 312 is discharged. In the case of the former flow route, the exhaust temperature discharged to the equipment exhaust system can be lowered by opening the on-off valve 326 and the intake valve 322 and mixing the air having a room temperature with the discharged air. In the latter flow route, the amount of the air discharged to the equipment exhaust system can be reduced by opening the on-off valve 326 to circulate a part or the entirety of the air. The controller 600 optimally controls the flow route, the speed of the fan 314, and the opening degrees of the intake valves 310 and 322, the exhaust valves 320 and 324 and the on-off valve 326 so that the temperature of the reaction tube accommodation chamber 205 is reduced at a desired rate and the amount of the introduced or discharged air is minimized while keeping the temperature of the air discharged to the equipment exhaust system (equipment exhaust duct) and the temperature of the air in the fan 314 at a predetermined level or lower.

At this time, the water cooling system 400 is controlled by the controller 600 so that the cooling fluid introduced from the cooling fluid supply port 402 is distributed to five units through the supply pipe 404, the needle valve 406 and the water supply side manifold 408, and the cooling fluid passed around the furnace opening, the inlet flange 332, the seal cap 44, the boat rotator 334, and the like are merged in the water drainage side manifold 450 and supplied to the radiator 312. As a result, the cooling fluid is supplied to the radiator 312 to exchange heat with the air flowing through the air circulation path 306, so that the air in the process furnace 12 is cooled. When the total flow rate of the cooling fluid supplied through the vicinity of the furnace opening of the process furnace 12, the inlet flange 332, the seal cap 44, the boat rotator 334, and the like is less than the flow rate required for the radiator 312, the opening degree of the needle valve 428 of the pipe 418 in the auxiliary system is adjusted. When the temperature of the merged cooling fluid is high, the radiator 312 exchanges heat between the air as a heat medium and the cooling fluid, thereby lowering the temperature of the cooling fluid.

The controller 600 can further perform optimal control between the air cooling system and the water cooling system 400 to minimize energy consumption. The energy consumption C and the heat H that can be dissipated at the time of rapid cooling are expressed as follows.

$$C = U_{air}, U_{water}) = ECF_{air} \times U_{air} + ECF_{water} \times U_{water}$$

$$H = g(U_{air}, U_{water}) = \text{Const}$$

Here, $U_{air}$ and $U_{water}$ are the use amounts of air and water used [m³], respectively, $U_{air}$=0.1507 [kWh/m³], and $U_{water}$=0.26 [kWh/m³]. H is a function of $U_{air}$ and $U_{water}$, which is used as a constant value in order to obtain a desired temperature drop rate, and the relationship between $U_{air}$ and $U_{water}$ is empirically obtained. $U_{air}$ and $U_{water}$ that minimize C can be solved numerically by Lagrange's undetermined multiplier method or the like. Further, $ECF_{air}$ and $ECF_{water}$ are the above-mentioned energy conversion coefficients, which are coefficients for calculating the energy consumed during the use of the apparatus, and are defined in the SEMI/ISMI standard S23. In the present embodiment, $ECF_{air}$ is the sum of the energy (0.147 kWh/m³) required to prepare clean dry air in a clean room and the energy (0.0037 kWh/m³) required for exhaust. $ECF_{water}$ is the energy required to prepare (supply and recover) the circulating cooling water, which is equivalent to the electricity bill for the cooling tower and the circulation pump.

In addition, an analytical solution can be obtained by modeling g ($U_{air}$, $U_{water}$) as follows.

$$g = a \cdot \frac{U_{air}}{b + U_{air}} \left(1 + c \cdot \frac{U_{water}}{d + U_{water}}\right)$$

In the above equation, a, b, c and d represent constants. The controller 600 can control the speed of the fan 314, the opening degree of the needle valve 428, and the like so as to match the $U_{air}$ and $U_{water}$ thus obtained.

(S15: Atmospheric Pressure Restoration)

When the preset processing time elapses, an inert gas is supplied through the gas introduction pipe line 328, so that the inside of the reaction tube 203 is replaced with the inert gas and the pressure in the reaction tube 203 is returned to the atmospheric pressure. Steps S14 and S15 may be performed in parallel, or the starting order thereof may be changed.

(S16: Boat Unloading and Wafer Discharging)

The boat 38 is slowly lowered by the boat elevator 42, and the lower end of the inlet flange 332 is opened. Then, the processed wafers 31 are unloaded from the lower end of the inlet flange 332 to the outside of the reaction tube 203 while being supported by the boat 38 (boat unloading). The processed wafers 31 are discharged from the boat 38 by the delivery machine 36 (wafer discharging).

(6) Other Embodiments

Figure 7:
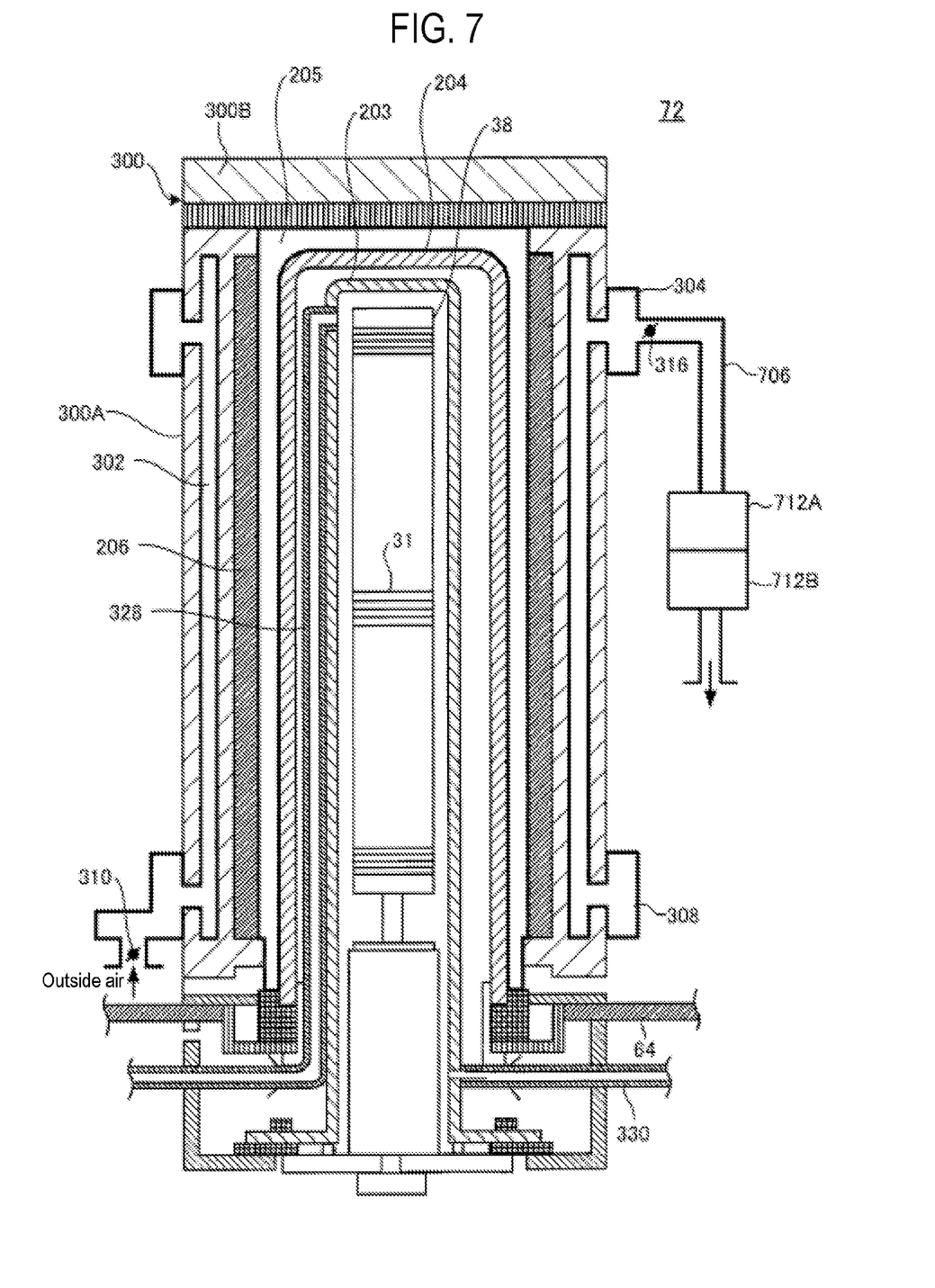
FIG. 7 is a vertical sectional view showing a modification of the process furnace preferably used in one embodiment of the present disclosure.

Next, a modification of the process furnace according to one embodiment of the present disclosure will be described with reference to FIG. 7. Now, the differences from the above-described embodiment will be mainly described, and the description of other points will be omitted.

The process furnace 72 is not provided with an air circulation path 306 that brings the upper chamber 304 and the lower chamber 308 into communication with each other. An exhaust flow path 706 is connected to the upper chamber 304. A radiator 712A and a radiator 712B are installed in the exhaust flow path 706. An on-off valve 316 is installed between the upper chamber 304 and the radiator 712A in the exhaust flow path 706.

The radiator 712B is supplied with the cooling fluid from the pipe 418, which is an auxiliary system in the water cooling system 400 described above. The cooling fluid that has cooled the radiator 712B and passed through the pipe 418 as the auxiliary system, and the cooling fluid flowing through the first unit 440, the second unit 442, the third unit 444 and the fourth unit 446 at a small flow rate are merged and supplied to the radiator 712A. As a result, the cooling fluid is supplied to the radiators 712A and 712B to exchange heat with the air which is a heat medium flowing through the exhaust flow path 706, and the cooled air is exhausted. That is, in this modification, a merging part for merging the cooling fluid flowing through the first unit to the fourth unit is installed in the radiator 712A.

Even when the above-mentioned process furnace 72 is used, the film formation can be performed under the same substrate processing process and processing conditions as when the above-mentioned process furnace 12 is used, and the same effects as those of the above-described embodiment can be obtained.

In the above-described embodiment, there has been described an example of forming a film using the substrate processing apparatus, which is a batch type vertical apparatus for processing a plurality of substrates at one time. However, the present disclosure is not limited thereto. The present disclosure may also be suitably applied to a case in which a film is formed using a single-substrate type substrate processing apparatus that processes one or several substrates at one time. That is, even when a single-substrate type substrate processing apparatus is used, the substrate processing process can be performed under the same processing procedure and processing conditions as those in the above-described embodiment, and the same effects as those of the above-described embodiment can be obtained.

Further, it is preferable that the recipe used in the substrate processing process is individually prepared according to the processing content and stored in the memory 600c via a telecommunication line or an external memory device 603. Then, when starting the substrate processing process, it is preferable that the CPU 600a appropriately selects an appropriate recipe from a plurality of recipes stored in the memory 600c according to the content of the substrate processing process. This makes it possible to form films having various film types, composition ratios, film qualities, and film thicknesses with good reproducibility by one substrate processing apparatus. In addition, the burden on the operator can be reduced, and the process can be started quickly while avoiding operation mistakes.

The above-mentioned recipe is not limited to the newly prepared one but may be prepared, for example, by modifying an existing recipe already installed in the substrate processing apparatus. When changing the recipe, the changed recipe may be installed on the substrate processing apparatus via a telecommunication line or a recording medium in which the recipe is recorded. In addition, the input/output device 602 included in the existing substrate processing apparatus may be operated to directly change the existing recipe already installed in the substrate processing apparatus.

According to the present disclosure in some embodiments, it is possible to stably supply a cooling fluid to multiple cooling units while reducing the total consumption of the cooling fluid.

While certain embodiments have been described, these embodiments have been presented by way of example and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
    a plurality of first coolers installed in or around a process furnace configured to process a substrate, and configured to perform cooling by a cooling fluid;
    a second cooler installed in or around the process furnace and configured to perform cooling by the cooling fluid, the second cooler being not included in the plurality of first coolers;
    a distributor configured to distribute the cooling fluid supplied from a cooling fluid supply port to the plurality of first coolers and an auxiliary system bypassing the plurality of first coolers; and
    a merging part configured to merge the cooling fluid passed through the plurality of first coolers and the cooling fluid passed through the auxiliary system, respectively, and supply the merged cooling fluid to the second cooler.

2. The substrate processing apparatus of claim 1, wherein the second cooler has a largest required flow rate of the cooling fluid or a largest amount of heat discharged to the cooling fluid among the plurality of first coolers and the second cooler.

3. The substrate processing apparatus of claim 2, wherein the second cooler is configured to cool a furnace body of the process furnace or a heat medium used to cool the furnace body by using the cooling fluid.

4. The substrate processing apparatus of claim 3, further comprising:
    a cooling system configured to circulate the heat medium for cooling the furnace body, wherein the second cooler is configured to exchange heat between the heat medium and the cooling fluid.

5. The substrate processing apparatus of claim 4, wherein the cooling system includes:
    a fan configured to suck the heat medium cooled by the second cooler and pump the heat medium to the process furnace, a first valve installed between the second cooler and the fan and configured to introduce the heat medium from an outside of the substrate processing apparatus, a second valve installed between the fan and the process furnace to discharge the heat medium to the outside of the substrate processing apparatus, and a controller configured to optimize a speed of the fan and opening degrees of the first valve and the second valve so as to minimize an amount of the heat medium to be introduced or discharged while keeping a temperature of the heat medium in the fan at a predetermined level or lower.

6. The substrate processing apparatus of claim 2, wherein the plurality of first coolers is configured to supply the cooling fluid in parallel.

7. The substrate processing apparatus of claim 2, wherein a minimum required flow rate of the cooling fluid in the second cooler is equal to or less than a total value of minimum required flow rates of the cooling fluid in the plurality of first coolers.

8. The substrate processing apparatus of claim 2, wherein the plurality of first coolers is configured to cool different objects, and at least one of the plurality of first coolers is configured to cool a furnace opening of the process furnace.

9. The substrate processing apparatus of claim 2, wherein the plurality of first coolers is configured to cool at least four selected from the group of an inlet flange provided at a furnace opening of the process furnace, a lid as a seal cap, a boat rotator, a casing of the process furnace, and an atmosphere in a delivery chamber.

10. The substrate processing apparatus of claim 1, wherein the second cooler is configured to cool an object in which an amount of heat received by the object fluctuates, and the auxiliary system is configured to open and close fluid communication between the distributor and the merging part according to the amount of heat received by the object.

11. The substrate processing apparatus of claim 1, further comprising:
a heat exchanger installed between the merging part and the second cooler and configured to cool the cooling fluid.

12. The substrate processing apparatus of claim 1, wherein the auxiliary system is configured to directly connect the distributor and the merging part via an on-off valve.

13. The substrate processing apparatus of claim 1, wherein a flow rate in the auxiliary system is set to minimize an energy consumed for air cooling and water cooling.

14. The substrate processing apparatus of claim 1, wherein the merging part is installed in the second cooler.

15. A method of manufacturing a semiconductor device using a substrate processing apparatus that comprises a plurality of first coolers installed in or around a process furnace configured to process a substrate, and configured to perform cooling by a cooling fluid, and a second cooler installed in or around the process furnace and configured to perform cooling by the cooling fluid, the second cooler being not included in the plurality of first coolers, the method comprising:
distributing, by a distributor, the cooling fluid supplied from a cooling fluid supply port to the plurality of first coolers and an auxiliary system; and
merging, by a merging part, the cooling fluid passed through the plurality of first coolers and the cooling fluid passed through the auxiliary system, respectively, and supplying the merged cooling fluid to the second cooler.

* * * * *